US009966420B2

(12) United States Patent
Kim

(10) Patent No.: US 9,966,420 B2
(45) Date of Patent: May 8, 2018

(54) DISPLAY DEVICES AND METHODS OF MANUFACTURING DISPLAY DEVICES

(71) Applicant: Samsung Display Co., Ltd., Yongin, Gyeonggi-Do (KR)

(72) Inventor: Do-Hoon Kim, Asan-si (KR)

(73) Assignee: Samsung Display Co., Ltd., Gyeonngi-do (KR)

( * ) Notice: Subject to any disclaimer, the term of this patent is extended or adjusted under 35 U.S.C. 154(b) by 388 days.

(21) Appl. No.: 14/534,023

(22) Filed: Nov. 5, 2014

(65) Prior Publication Data
US 2015/0243705 A1 Aug. 27, 2015

(30) Foreign Application Priority Data

Feb. 26, 2014 (KR) .................. 10-2014-0022469

(51) Int. Cl.
*H01L 27/15* (2006.01)
*H01L 33/52* (2010.01)
*H01L 27/32* (2006.01)
*H01L 51/52* (2006.01)
*H01L 27/12* (2006.01)

(52) U.S. Cl.
CPC ...... *H01L 27/3258* (2013.01); *H01L 51/5246* (2013.01); *H01L 27/1218* (2013.01)

(58) Field of Classification Search
CPC ..... H01L 27/15; H01L 27/153; H01L 27/156; H01L 33/54; H01L 27/32–27/3297; H01L 2227/32–2227/326
See application file for complete search history.

(56) References Cited

U.S. PATENT DOCUMENTS 6,501,227 B1 * 12/2002 Koyama ............. G09G 3/2022
257/72
6,689,492 B1 * 2/2004 Yamazaki ........... H01L 27/1214
257/102
7,019,455 B2 * 3/2006 Fukuoka ............. H01L 51/5246
313/504

(Continued)

FOREIGN PATENT DOCUMENTS

KR      10-0718968 B1    5/2007
KR   10-2007-0069410 A   7/2007

(Continued)

*Primary Examiner* — Maliheh Malek
(74) *Attorney, Agent, or Firm* — Knobbe, Martens Olson & Bear LLP

(57) ABSTRACT

A display device includes a substrate with a major surface and a cover opposing the substrate. An array of light emitting pixels is disposed over a generally central portion of the major surface, and interposed between the substrate and the cover. A seal is disposed over a peripheral portion of the substrate, and interposed between and interconnecting the substrate and the cover. Between the seal and the substrate, a lower insulation layer, an upper insulation layer, and a structure located between the lower and upper insulation layers and including at least one metal layer. The upper insulation layer includes an uneven top surface. A contour of the uneven top surface of the upper insulation layer may conform with or follow that of the top uneven surface of the structure. The seal contacts and is bonded to the uneven top surface of the upper insulation.

19 Claims, 10 Drawing Sheets

(56) References Cited

U.S. PATENT DOCUMENTS

| | | | | |
|---|---|---|---|---|
| 7,218,048 B2* | 5/2007 | Choi | G09G 3/3225 | 257/E27.129 |
| 7,723,721 B2* | 5/2010 | Udagawa | H01L 27/3262 | 257/40 |
| 2001/0038098 A1* | 11/2001 | Yamazaki | G09G 3/3233 | 257/72 |
| 2002/0017862 A1* | 2/2002 | Sasaki | H01J 9/242 | 313/582 |
| 2003/0230976 A1* | 12/2003 | Nishikawa | H01L 51/524 | 313/504 |
| 2004/0104673 A1* | 6/2004 | Hosokawa | H05B 33/04 | 313/512 |
| 2006/0027838 A1* | 2/2006 | Koo | H01L 27/3262 | 257/257 |
| 2007/0153208 A1* | 7/2007 | Sakaguchi | G02F 1/13458 | 349/149 |
| 2007/0229721 A1* | 10/2007 | Matsuda | G02F 1/136213 | 349/39 |
| 2008/0012484 A1* | 1/2008 | Park | H01L 51/5088 | 313/509 |
| 2008/0106661 A1* | 5/2008 | Kim | G02F 1/1345 | 349/40 |
| 2008/0224129 A1* | 9/2008 | Choi | H01L 27/1277 | 257/40 |
| 2008/0258154 A1* | 10/2008 | Arai | H01L 27/1285 | 257/79 |
| 2009/0039772 A1* | 2/2009 | Takashima | H01J 37/32541 | 313/504 |
| 2009/0101904 A1* | 4/2009 | Yamamoto | H01L 27/3258 | 257/59 |
| 2009/0218925 A1* | 9/2009 | Kwak | H01L 27/3276 | 313/243 |
| 2010/0012943 A1* | 1/2010 | Park | H01L 27/1251 | 257/66 |
| 2010/0014232 A1* | 1/2010 | Nishimura | B29C 45/14073 | 361/679.3 |
| 2010/0133517 A1* | 6/2010 | Lee | H01L 51/5052 | 257/40 |
| 2010/0271349 A1* | 10/2010 | Liu | G09G 3/3225 | 345/205 |
| 2011/0006972 A1* | 1/2011 | Tanaka | H01L 27/3276 | 345/76 |
| 2011/0018788 A1* | 1/2011 | Tanaka | H01L 51/5246 | 345/80 |
| 2011/0037068 A1* | 2/2011 | Yamazaki | H01L 27/1225 | 257/43 |
| 2011/0073885 A1* | 3/2011 | Kim | H01L 27/3211 | 257/89 |
| 2011/0109596 A1* | 5/2011 | Yoon | H01L 27/3272 | 345/204 |
| 2011/0266543 A1* | 11/2011 | Moriwaki | G02F 1/13624 | 257/59 |
| 2012/0013968 A1* | 1/2012 | Park | G02F 1/167 | 359/296 |
| 2012/0032582 A1* | 2/2012 | Chang | H01L 27/3269 | 313/504 |
| 2012/0099055 A1* | 4/2012 | Kim | B29D 11/00634 | 349/106 |
| 2012/0305952 A1* | 12/2012 | Takei | H01L 27/3216 | 257/89 |
| 2013/0002527 A1* | 1/2013 | Kim | H01L 29/786 | 345/82 |
| 2014/0022478 A1* | 1/2014 | Kim | G02F 1/1339 | 349/43 |
| 2014/0141545 A1* | 5/2014 | Lee | H01L 51/003 | 438/23 |
| 2014/0183458 A1* | 7/2014 | Lee | H01L 51/56 | 257/40 |
| 2014/0353659 A1* | 12/2014 | Park | H01L 27/1225 | 257/43 |
| 2015/0077958 A1* | 3/2015 | Takayuki | H05K 5/0217 | 361/759 |
| 2015/0108438 A1* | 4/2015 | Kim | H01L 27/3258 | 257/40 |
| 2015/0144904 A1* | 5/2015 | Jeong | H01L 27/326 | 257/40 |
| 2015/0171366 A1* | 6/2015 | Kim | H01L 51/5246 | 257/40 |
| 2016/0043349 A1* | 2/2016 | Park | H01L 51/5271 | 257/40 |
| 2016/0126494 A1* | 5/2016 | Jung | H01L 27/3258 | 257/72 |
| 2016/0233289 A1* | 8/2016 | Son | H01L 27/3258 | |
| 2016/0284783 A1* | 9/2016 | Kim | H01L 27/3276 | |
| 2016/0351344 A1* | 12/2016 | Kitsuda | H01G 9/2077 | |
| 2017/0031196 A1* | 2/2017 | Taniguchi | G02F 1/13394 | |
| 2017/0179212 A1* | 6/2017 | Kwon | H01L 27/3258 | |

FOREIGN PATENT DOCUMENTS

| | | |
|---|---|---|
| KR | 10-0897157 B1 | 5/2009 |
| KR | 10-2010-0006462 A | 1/2010 |
| KR | 10-0992141 B1 | 10/2010 |
| KR | 10-2011-0041321 A | 4/2011 |
| KR | 10-2014-0088737 A | 7/2014 |

* cited by examiner

DISPLAY DEVICES AND METHODS OF MANUFACTURING DISPLAY DEVICES

CROSS REFERENCE TO RELATED APPLICATION

This application claims priority under 35 U.S.C. § 119 to Korean patent Application No. 10-2014-0022469 filed on Feb. 26, 2014, the disclosure of which is hereby incorporated by reference herein in its entirety.

BACKGROUND

1. Technical Field

The present disclosure relates to flat panel display devices and methods of manufacturing flat panel display devices.

2. Description of the Related Art

Generally, an upper substrate and a lower substrate of a display device are combined using a sealing material. In combing of the upper substrate and the lower substrate, a laser may be irradiated from a laser generating device into a sealing region corresponding to a peripheral region of the display device. While the laser is irradiated into the sealing region, the phase of the sealing material may be changed from solid to liquid. Then, the phase of the sealing material may be changed from liquid to solid after predetermined time. The upper and the lower substrates may be combined in accordance with the phase change of the sealing material. To ensure proper adhesion strength between the lower and the upper substrates in the sealing region, the conventional display device may include the sealing material as well as an additional insulation layer or a metal layer disposed in the sealing region. However, in the conventional display device, the sealing material may be positioned on a level surface of the insulation layer or the metal layer, so the lower and the upper substrates may be easily separated by external impact and the like.

SUMMARY

Example embodiments provide display devices including concave and convex structures and sealants in peripheral regions to improve adhesion strength between substrates.

Example embodiments provide methods of manufacturing display devices including concave and convex structures and sealants in peripheral regions to improve adhesion strength between substrates.

One aspect of the invention provides a display device comprising: a first substrate comprising a major surface, and further comprising a display region disposed over a generally central portion of the major surface, and a peripheral region disposed around the display region; at least one lower insulation layer disposed over the first substrate; at least one transistor disposed over the at least one lower insulation layer over the display region of the first substrate; a light emitting structure disposed over the display region of the first substrate; a concave and convex structure disposed over the at least one lower insulation layer and over the peripheral region of the first substrate and comprising at least one metal layer; an upper insulation layer formed over the concave and convex structure and comprising an uneven top surface; a sealant contacting and bonded to the uneven top surface of the upper insulation layer; and a second substrate disposed over the light emitting structure, and bonded to the sealant.

In the foregoing display device, the sealant does not contact the at least one metal layer. The concave and convex structure may comprise: the at least one metal layer comprising a first metal layer disposed over the at least one lower insulation layer; first insulation layer pieces and second insulation layer pieces disposed over the first metal layer; and the at least one metal layer further comprising a second metal layer disposed over the first metal layer to cover the first and second insulation layer pieces. The display device may further comprise third insulation layer pieces, wherein the first metal layer includes a plurality of first openings, wherein each of the third insulation layer pieces is received in one of the first openings. The first metal layer may include a plurality of first openings, wherein the first insulation layer pieces are arranged such that each of the first insulation layer pieces is positioned between immediately neighboring two of the first openings, and wherein the second insulation layer pieces are arranged such that each of the second insulation layer pieces is arranged between immediately neighboring two of the first openings. Rows of the first insulation layer pieces and rows of the second insulation layer pieces are alternately arranged.

Still in the foregoing display device, the second metal layer may include a plurality of second openings each overlapping one of the first openings when viewing in a direction perpendicular to the major surface. The display device may further comprise: third openings formed through the upper insulation layer, the third insulation layer pieces, and the at least one lower insulation layer, wherein the sealant comprises protrusions extending through the third openings and contacting the first substrate. Each of the third openings may overlap one of the first openings when viewing in a direction perpendicular to the major surface. The at least one transistor may include a switching transistor and a driving transistor disposed over the least one insulation layer in the display region. The display device may further comprise: a capacitor disposed over the driving transistor.

Another aspect of the invention provides a method of manufacturing a display device, comprising: providing a first substrate having a major surface, and further comprising a display region disposed over a generally central portion of the major surface, and a peripheral region disposed around the display region; forming at least one lower insulation layer over the first substrate; forming at least one transistor over the at least one lower insulation layer and over the display region; forming a light emitting structure over the display region of the first substrate; forming a concave and convex structure over the at least one lower insulation layer over the peripheral region of the first substrate, and the concave and convex structure comprising at least one metal layer; forming an upper insulation layer with an uneven top surface over the concave and convex structure; providing a second substrate; and forming a sealant between the first and second substrates, wherein the sealant contacts and is bonded to the uneven top surface of the upper insulation layer, and is further bonded to the second substrate.

In the foregoing method, forming the concave and convex structure may comprise: forming a first metal layer of the at least one metal layer having a plurality of first openings on the at least one lower insulation layer; forming first insulation layer pieces and second insulation layer pieces on the first metal layer; and forming a second metal layer of the at least one metal layer on the first metal layer, the second metal layer having a plurality of second openings and covering the first and the second insulation layer pieces. The method may further comprise forming third insulation layer pieces in the first openings. The first, second and third insulation pieces may be simultaneously formed. The method may further comprise: forming third openings through the upper insulation layer, the third insulation layer pieces, and the at least one lower insulation layer, the third openings partially exposing the first substrate, wherein the sealant comprises protrusions extending through the third openings and contacting the first substrate. Each of the third openings may overlap the first openings when viewing in a direction perpendicular to the major surface.

Still another aspect of the invention provides a display device comprising: a substrate comprising a major surface; a cover opposing the substrate; an array of light emitting pixels disposed over a generally central portion of the major surface, and interposed between the substrate and the cover; a seal disposed over a peripheral portion of the substrate around the generally central portion, the seal interposed between and interconnecting the substrate and the cover; a lower insulation layer formed over the generally peripheral portion of the substrate; a first metal layer formed over the lower insulation layer and comprising holes which are spaced from each other; first insulation pieces, each received in one of the holes of the first metal layer; a second metal layer formed over the first metal layer, and comprising first raised portions and first valley portions each disposed between immediately neighboring two of the first raised portions; second insulation pieces each placed between the first metal layer and one of the first raised portions of the second metal layer; an upper insulation layer formed over the second metal layer, and comprising second raised portions formed over the first raised portions of the second metal layer and second valley portions each disposed between the immediately neighboring two of the second raised portions; wherein the seal is bonded to and contacts top surfaces and side surfaces of the second raised portions and surfaces of the second valley portions of the upper insulation layer, which is bonded to and contacts the first insulation pieces, each of which is bonded to and contacts the lower insulation layer.

In the foregoing display device, each of the second insulation pieces may comprise side surfaces contacting and bonded to the upper insulation layer. The second metal layer may comprise openings each overlapping to one of the holes of the first metal layer when viewing in a direction perpendicular to the major surface, and the upper insulation layer comprises protrusions extending through the openings to contact the first insulation pieces. Each of the lower insulation layer, the upper insulation layer and the second metal layer may comprise holes each overlapping one of the holes of the first metal layer when viewing in a direction perpendicular to the major surface, and the seal comprises protrusions extending through the holes to contact the substrate.

Still in the foregoing device, the array of light emitting pixels may comprise metal layers and insulation layers wherein each of the first and second layers is formed of the same material as that of one of the metal layers of the array of light emitting pixels, wherein each of the top and lower insulation layers is formed of the same material as that of one of the insulation layers of the array of light emitting pixels, wherein the first insulation pieces are formed of the same material as that of one of the insulation layers of the array of light emitting pixels, wherein the second insulation pieces are formed of the same material as that of one of the insulation layers of the array of light emitting pixels. At least one of the upper and lower insulation layers may comprise two or more sub-layers formed one by one. The seal does not contact any of the first and second metal layers.

According to one aspect of example embodiments, there is provided a display device including a first substrate, at least one insulation layer, at least one transistor, a light emitting structure, a concave and convex structure, a sealant, and a second substrate. The first substrate may have a display region and a peripheral region. The at least one insulation layer may be disposed on the first substrate. The at least one transistor may be disposed on the at least one insulation layer in the display region. The light emitting structure may be disposed on the at least one transistor. The concave and convex structure may be disposed on the at least one insulation layer in the peripheral region. The sealant may be disposed on the concave and convex structure. The second substrate may be disposed on the light emitting structure and the sealant.

In example embodiments, the concave and convex structure may include at least one insulation layer pattern and at least one metal layer pattern.

In example embodiments, the concave and convex structure may include a first metal layer pattern, first insulation layer patterns, and second metal layer pattern. The first metal layer pattern may be disposed on the at least one insulation layer. The first insulation layer patterns and the second insulation layer patterns may be disposed on the first metal layer pattern. The second metal layer pattern may be disposed on the first metal layer pattern. The second metal layer pattern may substantially cover the first and the second insulation layer patterns.

In example embodiments, the first metal layer pattern may have a plurality of first openings. The first insulation layer patterns may be arranged between adjacent first openings along a column direction or a row direction. The second insulation layer patterns may be arranged between the adjacent first openings along the row direction or the column direction.

In some example embodiments, the first insulation layer patterns and the second insulation layer patterns may be alternately arranged along the row direction or the column direction.

In some example embodiments, the second metal layer pattern may have a plurality of second openings. For example, each of the second openings may have a size substantially the same as a size of each the first openings.

In example embodiments, the at least one insulation layer may include a first insulation layer, a second insulation layer, and a third insulation layer. The first insulation layer may be disposed on the first substrate. The second insulation layer may be positioned on the first insulation layer. The third insulation layer may be located on the second insulation layer.

In example embodiments, the first metal layer pattern may be disposed on the second insulation layer, and the first openings may be filled with the third insulation layer.

In some example embodiments, the concave and convex structure may additionally include a fourth insulation layer disposed on the second metal layer.

In some example embodiments, the concave and convex structure may additionally include third openings formed through the fourth insulation layer, the third insulation layer, the second insulation layer, and the first insulation layer. The third openings may partially expose the first substrate. Each of the third openings may be positioned in each of the first openings.

In example embodiments, the sealant may contact the first substrate through the third openings.

In example embodiments, the at least one transistor may include a switching transistor and a driving transistor disposed on the least one insulation layer in the display region.

In some example embodiments, the display device may additionally include a capacitor disposed on the driving transistor.

According to another aspect of example embodiments, there is provided a method of manufacturing a display device. In the method, a first substrate having a display region and a peripheral region may be provided. At least one insulation layer may be formed on the first substrate. At least one transistor may be formed on the at least one insulation layer in the display region. A light emitting structure may be formed on the at least one transistor. A concave and convex structure may be formed on the at least one insulation layer in the peripheral region. A sealant may be formed on the concave and convex structure. A second substrate may be formed on the light emitting structure and the sealant.

In forming of the concave and convex structure according to example embodiments, a first metal layer pattern may be formed on the at least one insulation layer. The first metal layer pattern may have a plurality of first openings. First insulation layer patterns and second insulation layer patterns may be formed on the first metal layer pattern. A second metal layer pattern may be formed on the first metal layer pattern. The second metal layer pattern may have a plurality of second openings and may substantially cover the first and the second insulation layer patterns.

In forming of the at least one insulation layer according to example embodiments, a first insulation layer may be formed on the first substrate. A second insulation layer may be formed on the first insulation layer. A third insulation layer may be formed on the second insulation layer.

In some example embodiments, the first and the second insulation patterns and the third insulation layer may be simultaneously formed.

In example embodiments, the first metal layer pattern may be formed on the second insulation layer, and the first openings may be filled with the third insulation layer.

In forming of the concave and convex structure according to some example embodiments, a fourth insulation layer may be additionally formed on the second metal layer.

In forming of the concave and convex structure according to some example embodiments, a plurality of third openings may be formed by partially removing the fourth insulation layer, the third insulation layer, the second insulation layer, and the first insulation layer. The third openings may partially expose the first substrate.

In example embodiments, each of the third openings may be formed in each of the first openings.

According to example embodiments, the display device may include the concave and convex structure having uneven top surfaces, at least one metal layer and at least one insulation layer pattern. The concave and convex structure may be disposed on the sealant, so that adhesion strength between the first substrate and the second substrate may be enhanced.

BRIEF DESCRIPTION OF THE DRAWINGS

Example embodiments can be understood in more detail from the following description taken in conjunction with the accompanying drawings, in which.

DESCRIPTION OF EMBODIMENTS

Figure 1:
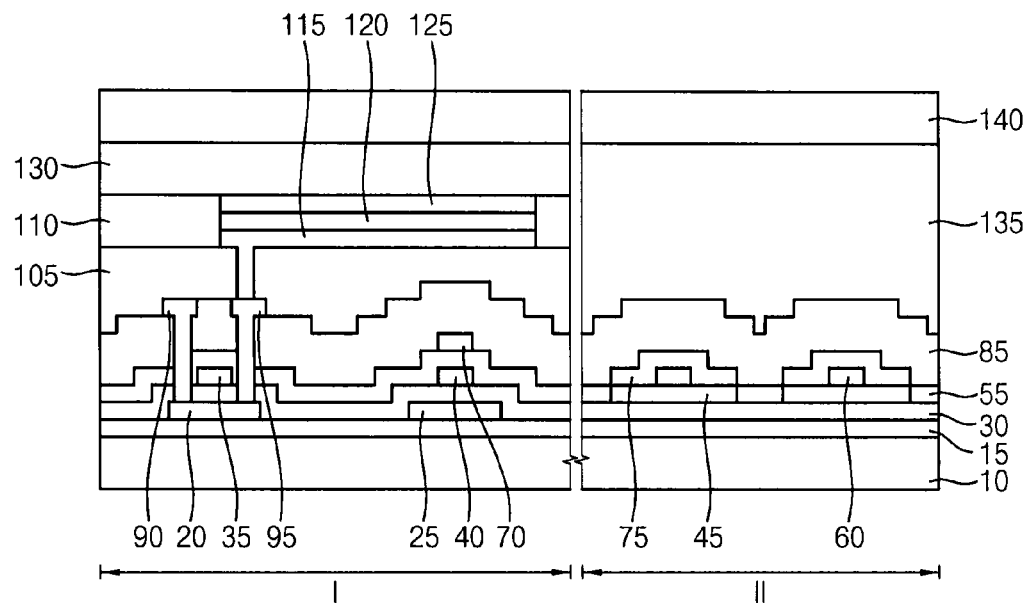
FIG. 1 is a cross-sectional view illustrating a display device in accordance with example embodiments.

Hereinafter, example embodiments of the invention will be described in detail with reference to the accompanying drawings. In the drawings, identical or similar reference numerals may represent identical or similar elements.

Figure 6:
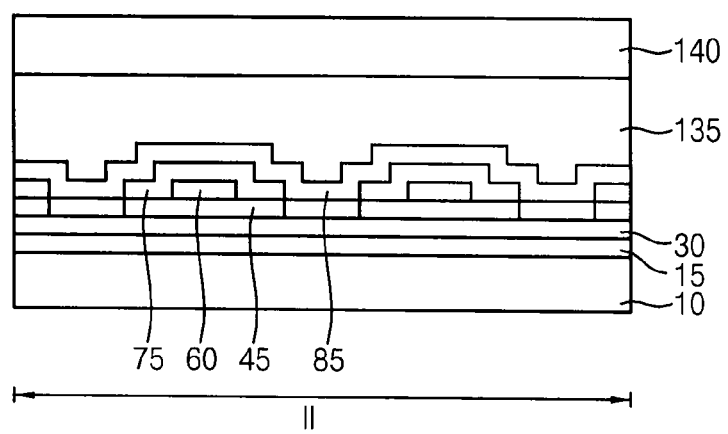
FIG. 6 is a cross-sectional view illustrating the concave and convex structure taken along a line I-I' in FIG. 2.
Figure 7:
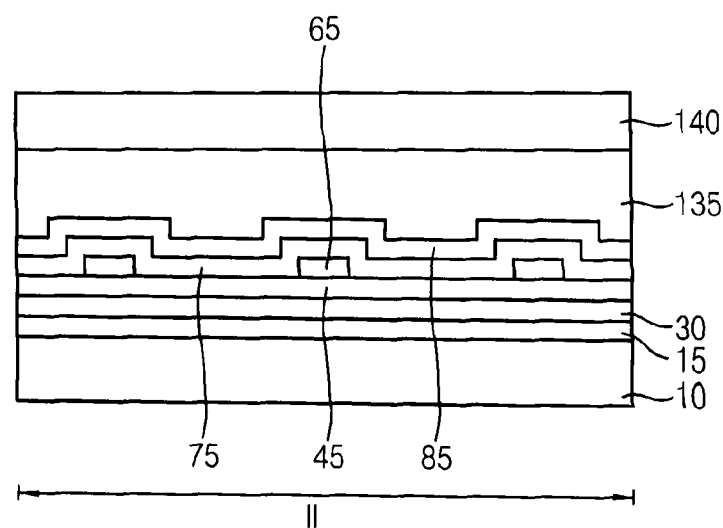
FIG. 7 is a cross-sectional view illustrating the concave and convex structure taken along a line II-II' in FIG. 2.

FIG. 1 is a cross-sectional view illustrating a display device according to example embodiments. FIGS. 2 to 5 are perspective views illustrating a concave and convex structure of display device in accordance with example embodiments. FIG. 6 is a cross-sectional view illustrating the concave and convex structure taken along a line I-I' in FIG. 2. FIG. 7 is a cross-sectional view illustrating the concave and convex structure taken along a line II-II' in FIG. 2.

Referring to FIG. 1, the display device according to example embodiments may include a first substrate 10, a first insulation layer 15, a first active element 20, a second active element 25, a second insulation layer 30, a first electrode 35, a second electrode 40, a first metal layer 45, third insulation layer pieces 55, first insulation layer pieces 60, second insulation layer pieces 65 (see FIG. 4), a third electrode 70, a second metal layer 75, a fourth insulation layer 85, a source electrode 90, a drain electrode 95, a fifth insulation layer 105, a pixel defining layer 110, a lower electrode 115, a light emitting layer 120, an upper electrode 125, a protecting layer 130, a sealant 135, a second substrate 140, etc. In example embodiments, a light emitting structure of the display device may include the bottom electrode 115, the light emitting layer 120 and the top electrode 125. Additionally, the concave and convex structure of the display device may include the first metal layer 45, the first insulation layer pieces 60, the second insulation layer pieces 65, the second metal layer 75, and the fourth insulation layer 85.

The first substrate 10 may have a display region I and a peripheral region II. The first substrate 10 may include a transparent inorganic material or flexible plastic. For example, the first substrate 10 may include a rigid glass substrate, a quartz substrate, etc. Alternatively, the first substrate 10 may include a flexible transparent resin substrate. Here, the flexible transparent resin substrate for the first substrate 10 may include a polyimide substrate. For example, the polyimide substrate may include a first polyimide layer, a barrier film layer, a second polyimide layer, etc. In some example embodiments, the first substrate 10 may have a stacked structure in which the first polyimide layer, the barrier film layer, and the second polyimide layer are stacked on a glass substrate. Here, after the first insulation layer 15 is provided on the second polyimide layer, upper structures may be positioned on the first insulation layer 15. After the upper structures are provided, the glass substrate may be removed. It may be difficult that the upper structures are directly formed on the polyimide substrate because the polyimide substrate is thin and flexible. Accordingly, after the upper structures are formed on a rigid glass substrate, the polyimide substrate may be used as the first substrate 10 by removal of the glass substrate.

The first insulation layer 15 may be disposed on the first substrate 10. The first insulation layer 15 may extend from the display region I to the peripheral region II. The first insulation layer 15 may include an inorganic material. For example, the first insulation layer 15 may include a silicon compound such as silicon oxide (SiOx), silicon nitride (SiNx), silicon oxynitride (SiOxNy), silicon oxycarbide (SiOxCy), silicon carbonitride (SiCxNy), etc. In some example embodiments, the first insulation layer 15 may include an organic material. For example, the first insulation layer 15 may include polyimide-based resin, photoresist, acrylic-based resin, polyamide-based resin, siloxane-based resin, etc. These may be used alone or in a combination thereof.

As illustrated in FIG. 1, the first active element 20 and the second active element 25 may be disposed on the first insulation layer 15 in the display region I. The first active element 20 and the second active element 25 may be spaced apart on the first insulation layer 15 by a predetermined distance. In example embodiments, each of the first active element 20 and the second active element 25 may include oxide semiconductor, inorganic semiconductor (e.g., amorphous silicon, polysilicon, etc.), organic semiconductor, etc.

The second insulation layer 30 may be located on the first insulation layer 15. The second insulation layer 30 may cover the first active element 20 and the second active element 25 in the display region I. In the peripheral region II, the second insulation layer 30 may be directly disposed on the first insulation layer 15. The second insulation layer 30 may include an inorganic material. For example, the second insulation layer 30 may include a silicon compound such as SiOx, SiNx, SiOxNy, SiOxCy, SiCxNy, etc. These may be used alone or in a combination thereof. Alternatively, the second insulation layer 30 may include an organic material. For example, the second insulation layer 30 may include polyimide-based resin, photoresist, acrylic-based resin, polyamide-based resin, siloxane-based resin, etc. These may be used alone or in a combination thereof.

Figure 3:
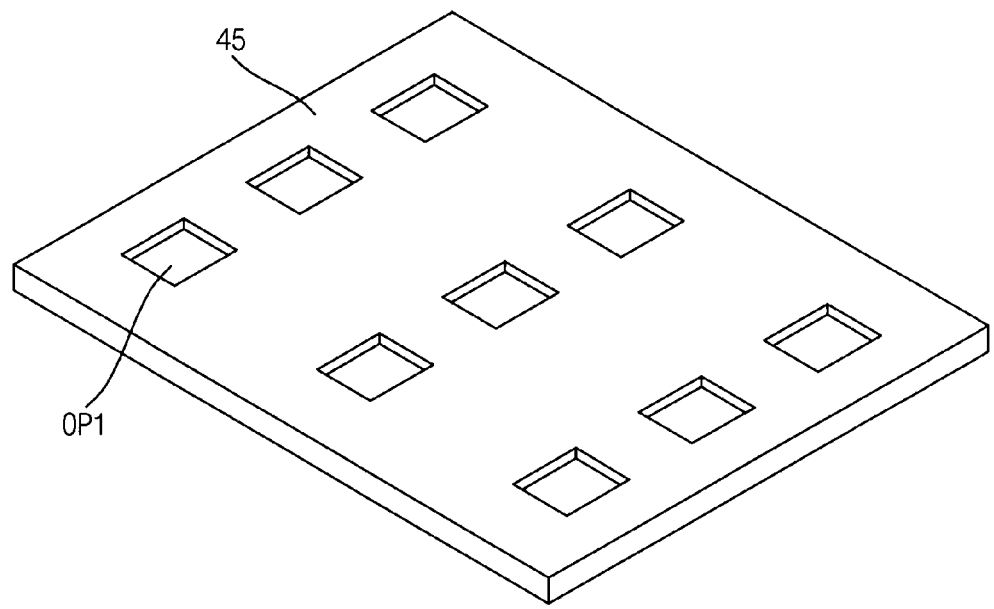

The first electrode 35, the second electrode 40 and the first metal layer 45 may be positioned on the second insulation layer 30. In example embodiments, the first electrode 35 and the second electrode 40 may be disposed in the display region I, and the first metal layer 45 may be positioned in the peripheral region II. In display region I, the first electrode 35 and the second electrode 40 may be disposed on the second insulation layer 30. The first active element 20 and the second active element 25 may be disposed under the second insulation layer 30. Here, each of the first electrode 35 and the second electrode 40 may be positioned over the first active element 20 and the second active element 25, respectively. In example embodiments, the first metal layer 45 may include a plurality of first openings OP1 spaced apart by a predetermined distance, as illustrated in FIG. 3. In this case, the first openings OP1 may be regularly arranged along a row direction or a column direction. For example, the first metal layer 45 may have a substantial mesh structure.

Each of the first electrode 35, the second electrode 40 and the first metal layer 45 may include metal, alloy, metal nitride, conductive metal oxide, a transparent conductive material, etc. For example, each of the first electrode 35, the second electrode 40 and the first metal layer 45 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a combination thereof. In example embodiments, the first electrode 35, the second electrode 40 and the first metal layer 45 may be simultaneously formed.

Referring again to FIG. 1, the third insulation layer pieces 55 may be disposed on the second insulation layer 30. In the display region I, the third insulation layer pieces 55 may be positioned on the second insulation layer 30 to substantially cover the first electrode 35 and the second electrode 40. In the peripheral region II, the third insulation layer pieces 55 may be disposed on the second insulation layer 30 to substantially fill the first openings OP1 in the first metal layer 45. In this case, a plurality of first insulation layer pieces 60 and a plurality of second insulation layer pieces 65 may be disposed on the first metal layer 45.

Figure 4:
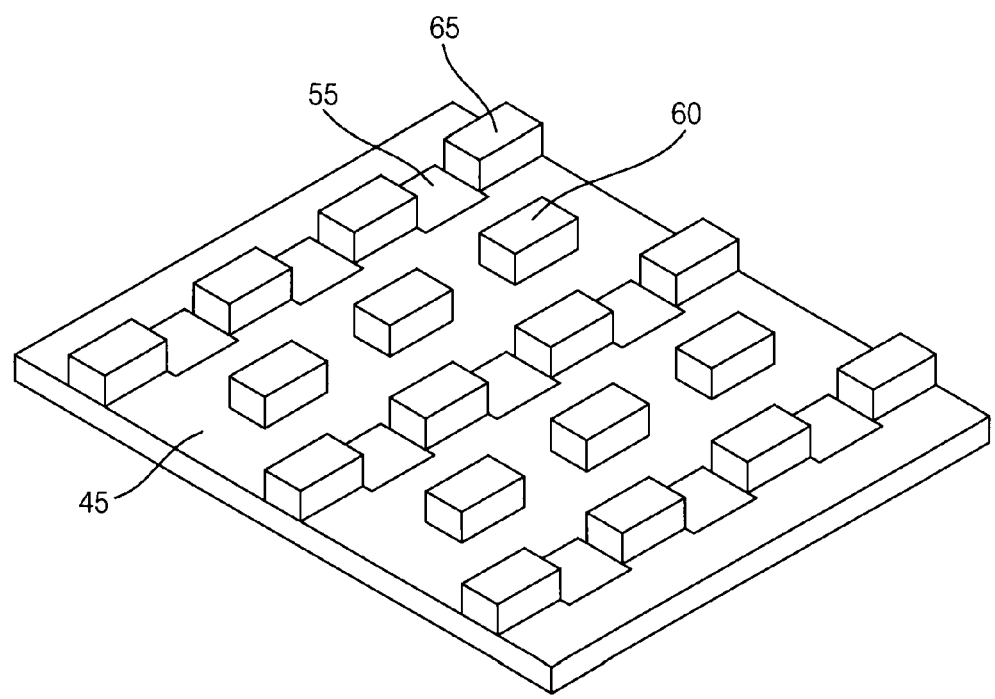

In example embodiments, the third insulation layer pieces 55 in the peripheral region II may substantially fill the first openings OP1 of the first metal layer 45, as illustrated FIG. 4. Here, the first insulation layer pieces 60 may be arranged on the first metal layer 45 between adjacent first openings OP1. The second insulation layer pieces 65 may be arranged on the first metal layer 45, and may be spaced apart from the first insulation layer pieces 60 by predetermined distances. The first insulation layer pieces 60 and the second insulation layer pieces 65 may be alternately arranged along the row direction or the column direction. For example, the first insulation layer pieces 60 may be disposed on the first metal layer 45 between adjacent first openings OP1 along the column direction. Additionally, the second insulation layer pieces 65 may be disposed on the first metal layer 45 between the adjacent first openings OP1 along the row direction.

In example embodiments, after the third insulation layer pieces 55 may be generally formed in the display region I and the peripheral region II, the first insulation layer pieces 60 and the second insulation layer pieces 65 may be obtained by patterning the third insulation layer pieces 55 positioned on the first metal layer 45 in the peripheral region II.

The third insulation layer pieces 55, the first insulation layer pieces 60 and the second insulation layer pieces 65 may include an inorganic material. For example, the third insulation layer pieces 55, the first insulation layer pieces 60 and the second insulation layer pieces 65 may include a silicon compound such as SiOx, SiNx, SiOxNy, SiOxCy, SiCxNy, etc. These may be used alone or in a combination thereof. Alternatively, the second insulation layer 30 may include an organic material. For example, the second insulation layer 30 may include polyimide-based resin, photoresist, acrylic-based resin, polyamide-based resin, siloxane-based resin, etc. These may be used alone or in a combination thereof.

As illustrated in FIG. 1, the third electrode 70 in the display region I may be disposed on a portion of the third insulation layer pieces 55, and the second electrode 40 may be disposed under the third insulation layer pieces 55. Here, the third electrode 70 may be positioned over the second electrode 40. Further, in peripheral region II, the second metal layer 75 substantially covering the first insulation layer pieces 60 and the second insulation layer pieces 65 may be disposed on the first metal layer 45. Here, the second metal layer 75 may have a substantial concave and convex shape along a profile of the first and the second insulation layer pieces 60 and 65. A total size of the second metal layer 75 may be substantially the same as or substantially similar to that of the first metal layer 45.

Figure 5:
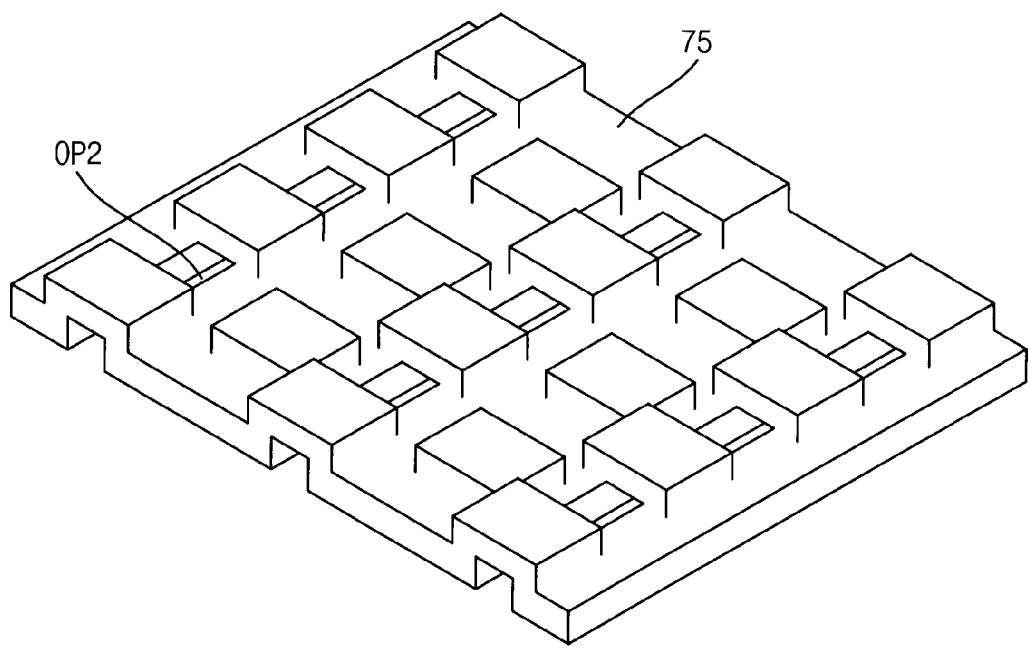

In example embodiments, the second metal layer 75 may have a plurality of second openings OP2 as illustrated in FIG. 5. A size of each second opening OP2 in the second metal layer 75 may be substantially the same as or substantially similar to that of each first opening OP1 in the first metal layer 45. Accordingly, the second metal layer 75 may contact at least of portions of the first metal layer 45.

In accordance with a shape of the second metal layer 75, the concave and convex structure may be provided in the peripheral region II. In example embodiments, the concave and convex structure may include the first metal layer 45, the first insulation layer pieces 60, the second insulation layer pieces 65, and the second metal layer 75. For example, the first and the second insulation layer pieces 60 and 65 may be disposed on the first metal layer 45 having the first openings OP1. Further, the second metal layer 75 having the second openings OP2 may be disposed on the first and the second insulation layer pieces 60 and 65, so the concave and convex structure may be provided on the second insulation layer 30.

In example embodiments, the third electrode 70 in the display region I and the second metal layer 75 in the peripheral region II may be simultaneously formed. Each of the third electrode 70 and the second metal layer 75 may include metal, alloy, metal nitride, conductive metal oxide, a transparent conductive material, etc. For example, the third electrode 70 and the second metal layer 75 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a combination thereof.

As illustrated in FIG. 1, in the display region I, the first active element 20, the second insulation layer 30, the first electrode 35, the source electrode 90 and the drain electrode 95 may provide a switching element such as a switching transistor. In addition, the second active element 25, the second insulation layer 30, and the second electrode 40 may provide a driving element such as a driving transistor. Furthermore, the second electrode 40, the third insulation layer pieces 55 and the third electrode 70 may provide a capacitor. In example embodiments, a size of the display device may be reduced when the capacitor is disposed on the driving element.

The fourth insulation layer 85 may be generally disposed in the display region I and the peripheral region II. The fourth insulation layer 85 may have a thickness for entirely covering underlying structures such as the concave and convex structure, the switching element, the driving element, the capacitor, etc. In the display region I, the fourth insulation layer 85 may be positioned on the third insulation layer pieces 55 to substantially cover the third electrode 70. In peripheral region II, the fourth insulation layer 85 may be disposed on the third insulation layer pieces 55 to entirely cover the concave and convex structure. The fourth insulation layer 85 may have a substantial concave and convex shape along a profile of the concave and convex structure. In embodiments, each of the fourth insulation layer 85 and the concave and convex structure includes an uneven top surface. A contour of the uneven top surface of the upper insulation layer 85 may conform with or follow that of the top uneven surface of the concave and convex structure. The fourth insulation layer 85 may include an inorganic material. For example, the fourth insulation layer 85 may include a silicon compound such as SiOx, SiNx, SiOxNy, SiOxCy, SiCxNy, etc. These may be used alone or in a combination thereof. Alternatively, the fourth insulation layer 85 may include an organic material. For example, the fourth insulation layer 85 may include polyimide-based resin, photoresist, acrylic-based resin, polyamide-based resin, siloxane-based resin, etc. These may be used alone or in a combination thereof.

Referring again to FIG. 1, contact holes may be formed through the fourth insulation layer 85, the third insulation layer pieces 55, and the second insulation layer 30 in the display region I. The contact holes may expose the first active element 20. The source electrode 90 and the drain electrode 95 may contact a source region and a drain region of the first active element 20, respectively. The source and the drain electrodes 90 and 95 may be disposed on the fourth insulation layer 85, so that the contact holes may be filled with the source and the drain electrodes 90 and 95. Each of the source electrode 90 and the drain electrode 95 may include metal, alloy, metal nitride, conductive metal oxide, a transparent conductive material, etc. For example, each of the source electrode 90 and the drain electrode 95 may include Al, aluminum alloy, AlNx, Ag, silver alloy, W, WNx, Cu, copper alloy, Ni, Cr, CrNx, Mo, molybdenum alloy, Ti, TiNx, Pt, Ta, TaNx, Nd, Sc, SRO, ZnOx, ITO, SnOx, InOx, GaOx, IZO, etc. These may be used alone or in a combination thereof.

In the display region I, the fifth insulation layer 105 may be disposed on the fourth insulation layer 85. The fifth insulation layer 105 may include an inorganic material. For example, the fifth insulation layer 105 may include a silicon compound such as SiOx, SiNx, SiOxNy, SiOxCy, SiCxNy, etc. These may be used alone or in a combination thereof. In some example embodiments, the fifth insulation layer 105 may include an organic material. For example, the fifth insulation layer 105 may include polyimide-based resin, photoresist, acrylic-based resin, polyamide-based resin, siloxane-based resin, etc. These may be used alone or in a combination thereof.

A hole partially exposing the drain electrode 95 may be formed through the fifth insulation layer 105. Here, the bottom electrode 115 may be disposed on the fifth insulation layer 105 so that the hole may be filled with the bottom electrode 115. Thus, the bottom electrode 115 may be electrically connected to the drain electrode 95. The bottom electrode 115 may include metal, alloy, metal nitride, conductive metal oxide, a transparent conductive material, etc. For example, the bottom electrode 115 may include Al, aluminum alloy, AlNx, Ag, silver alloy, W, WNx, Cu, copper alloy, Ni, Cr, CrNx, Mo, molybdenum alloy, Ti, TiNx, Pt, Ta, TaNx, Nd, Sc, SRO, ZnOx, ITO, SnOx, InOx, GaOx, IZO, etc. These may be used alone or in a combination thereof.

The pixel defining layer 110 may be disposed on the fifth insulation layer 105 so that the bottom electrode 115 may be confined by the pixel defining layer 110. The pixel defining layer 110 may include an inorganic material. For example, the pixel defining layer 110 may include a silicon compound such as SiOx, SiNx, SiOxNy, SiOxCy, SiCxNy, etc. These may be used alone or in a combination thereof. In some example embodiments, the pixel defining layer 110 may include an organic material. For example, the pixel defining layer 110 may include polyimide-based resin, photoresist, acrylic-based resin, polyamide-based resin, siloxane-based resin, etc. These may be used alone or in a combination thereof.

The light emitting layer 120 may be positioned on the bottom electrode 115 to expose the bottom electrode 115. The light emitting layer 120 may be located the exposed bottom electrode 115. The light emitting layer 120 may have a multi-layered structure including an organic light emitting layer (EL), a hole injection layer (HIL), a hole transfer layer (HTL), an electron transfer layer (ETL), an electron injection layer (EIL), etc. In example embodiments, the organic light emitting layer may include light emitting materials capable of generating different colors of light such as a red color of light, a blue color of light, and a green color of light in accordance with the types of pixels in the display device. In some example embodiments, the organic light emitting layer may generally generate a white color of light by stacking a plurality of light emitting materials capable of generating different colors of light such as a red color of light, a green color of light, a blue color of light, etc.

The top electrode 125 may be disposed on the light emitting layer 120. The top electrode 125 may include metal, alloy, metal nitride, conductive metal oxide, a transparent conductive material, etc. For example, the top electrode 125 may include Al, aluminum alloy, AlNx, Ag, silver alloy, W, WNx, Cu, copper alloy, Ni, Cr, CrNx, Mo, molybdenum alloy, Ti, TiNx, Pt, Ta, TaNx, Nd, Sc, SRO, ZnOx, ITO, SnOx, InOx, GaOx, IZO, etc. These may be used alone or in a combination thereof.

The protecting layer 130 may be disposed on the pixel defining layer 110 and the top electrode 125 in the display region I. The sealant 135 may be provided on the fourth insulation layer 85 in the peripheral region II. The protecting layer 130 may include an inorganic material. For example, the protecting layer 130 may include a silicon compound such as SiOx, SiNx, SiOxNy, SiOxCy, SiCxNy, etc. These may be used alone or in a combination thereof selectively, the protecting layer 130 may include an organic material. For example, the protecting layer 130 may include polyimide-based resin, photoresist, acrylic-based resin, polyamide-based resin, siloxane-based resin, etc. These may be used alone or in a combination thereof.

In example embodiments, the sealant 135 may have a substantial level surface on the fourth insulation layer 85 covering the concave and convex structure in peripheral region II. A contact interface between the sealant 135 and the fourth insulation layer 85 may be increased because the fourth insulation layer 85 may have a substantial enlarged surface according to the shape of the concave and convex structure. Accordingly, adhesion strength of the sealant 135 may be enhanced. For example, the sealant 135 may include frit and the like. In some example embodiments, the sealant 135 may additionally include a photo curable material. For example, the sealant 135 may include a compound such as the organic material and the photo curable material. In addition, a cured sealant 135 may be obtained after ultraviolet ray, laser beam, visible ray, etc. are irradiated in the sealant 135. For example, the photo curable material included in the sealant 135 may include epoxy acrylate-based resin, polyester acrylate-based resin, urethane acrylate based-resin, polybutadine acrylate-based resin, silicon acrylate-based resin, alkyl acrylate-based resin, etc.

The second substrate 140 may be disposed on the protecting layer 130 and the sealant 135. The second substrate 140 may include a transparent insulation material, a flexible material, etc. For example, the second substrate 140 may include a glass substrate, a quartz substrate, a transparent resin substrate, etc. Alternatively, the second substrate 140 may have a stacked configuration that at least one organic layer and at least one inorganic layer may be alternately stacked. In this case, the inorganic layer may include silicon oxide, silicon nitride, silicon oxynitride, silicon oxycarbide, silicon carbonitride, aluminum oxide, aluminum nitride, titanium oxide, zinc oxide, etc. Additionally, the organic layer may include acrylate monomer, phenylacetylene, diamine, dianhydride, siloxane, silane, parylene, olefin-based polymer, polyethylene terephthalate, fluorine resin, polysiloxane, etc.

In example embodiments, to combine the first substrate 10 and the second substrate 140, a laser may be irradiated into the peripheral region II where the concave and convex structure and the sealant 135 are disposed. According to the laser irradiation, a phase of the sealant 135 may be changed from a solid phase to a liquid phase. In addition, the sealant 135 of the liquid phase may be cured to the solid phase after a predetermined time. In accordance with the phase change of the sealant 135, the second substrate 140 may be combined with the first substrate 10 to seal the second substrate 140 and the first substrate 10. The first and the second metal layer 45 and 75 in the peripheral region II may absorb and/or reflect energy of the laser while the laser is irradiated. The energy absorbed and/or reflected by the first metal layer 45 and the second metal layer 75 may be transferred to the sealant 135. Here, the energy may contribute to the phase change of the sealant 135. According as the fourth insulation layer 85 is provided on the concave and convex structure, a contact interface between the sealant 135 and the fourth insulation layer 85 may be increased. Accordingly, adhesion strength the first substrate 10 and the second substrate 140 may be enhanced.

Hereinafter, the concave and convex structure of the display device in accordance with example embodiments of the invention will be described in more detail with reference to the accompanying drawings.

Figure 2:
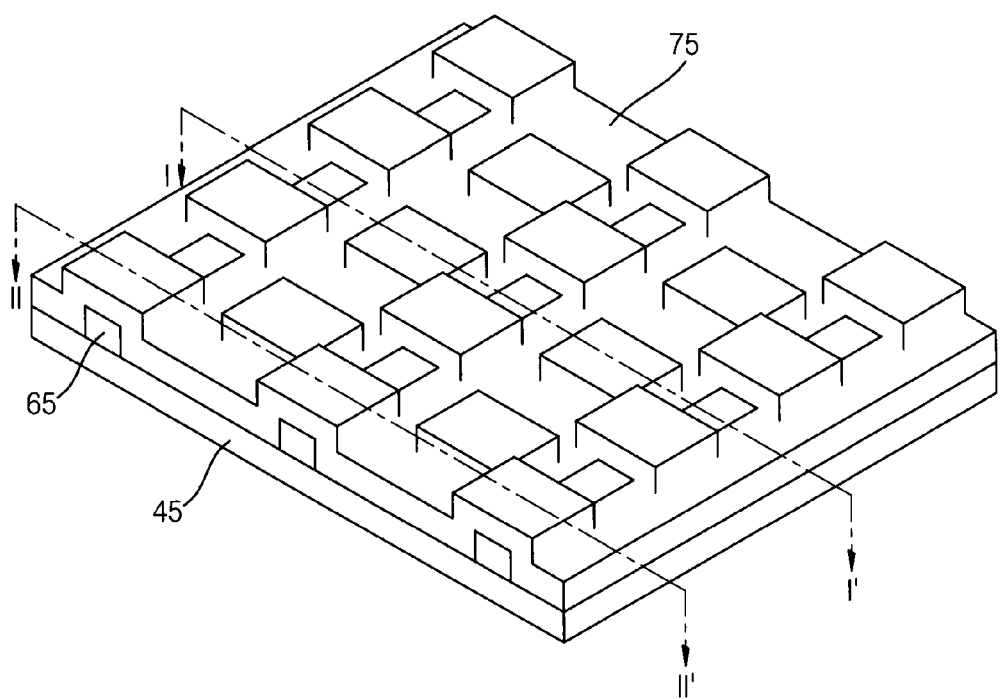
FIGS. 2 to 5 are perspective views illustrating a concave and convex structure of display device in accordance with example embodiments.

FIG. 6 is a cross-sectional view illustrating the concave and convex structure taken along a line I-I' in FIG. 2. FIG. 7 is a cross-sectional view illustrating the concave and convex structure taken along a line II-II' in FIG. 2.

Referring to FIGS. 6 and 7, the first insulation layer 15 may be disposed on the first substrate 10. The second insulation layer 30 may be positioned on the first insulation layer 15. As illustrated in FIGS. 2 and 3, the first metal layer 45 may have the plurality of the first openings OP1. For example, the first metal layer 45 may generally have a substantial mesh shape.

The first metal layer 45 may be positioned on the second insulation layer 30. The first insulation layer pieces 60 and the second insulation layer pieces 65 may be disposed on the first metal layer 45. The first insulation layer pieces 60 may be arranged on the first metal layer 45 between the first openings OP1 along the row direction or the column direction. The second insulation layer pieces 65 may be disposed on the first metal layer 45 such that the second insulation layer pieces 65 may be spaced apart from the first insulation layer pieces 60 along the row direction or the column direction. In this case, the first insulation layer pieces 60 and the second insulation layer pieces 65 may be alternately arranged along the row direction or the column direction. For example, when the first insulation layer pieces 60 are arranged between the first openings OP1 along the row direction, the second insulation layer pieces 65 may be arranged between the second openings OP2 along the column direction. Meanwhile, when the second insulation layer pieces 65 may be arranged between the adjacent first openings OP1 along the row direction, the first insulation layer pieces 60 may be arranged between the adjacent first openings OP1 along the column direction.

In example embodiments, each of adjacent first insulation layer pieces 60 and adjacent second insulation layer pieces 65 may be spaced apart by predetermined distances. For example, the adjacent first insulation layer pieces 60 may be spaced apart by a first distance, and the adjacent second insulation layer pieces 65 may be spaced apart by a second distance. In this case, the second distance between the adjacent second insulation layer pieces 65 may be substantially greater than the first distance between the adjacent first insulation layer pieces 60.

In example embodiments, the first and the second insulation layer pieces 60 and 65 may be obtained by patterning the third insulation layer pieces 55 located on the first metal layer 45 in the peripheral region II after the third insulation layer pieces 55 is formed from the display region I to the peripheral region II.

As illustrated in FIG. 7, the second metal layer 75 may be disposed on the first metal layer 45 so that the second metal layer 75 may substantially cover the first and the second insulation layer pieces 60 and 65. A total size of the second metal layer 75 may be substantially the same as or substantially similar to that of the first metal layer 45. In addition, the second metal layer 75 may have the plurality of the second openings OP2. Here, a size of the second openings OP2 of the second metal layer 75 may be substantially the same as or substantially similar to that of the first openings OP1 of the first metal layer 45. Accordingly, the second metal layer 75 may make contact to at least of portions of the first metal layer 45. As illustrated in FIG. 7, the second metal layer 75 may contact the first metal layer 45 as the first and the second insulation layer pieces 60 and 65 may be interposed between the first metal layer 45 and the second metal layer 75. According to a position of the second metal layer 75, a preliminary concave and convex structure may be provided in the peripheral region II of the display device.

As illustrated in FIGS. 6 and 7, the fourth insulation layer 85 may be disposed on the second metal layer 75, and the sealant 135 may be disposed on the fourth insulation layer 85. The second substrate 140 may be positioned at an upper portion of the first substrate 10 as the sealant 135 may be interposed between the first substrate 10 and the second substrate 140. As the fourth insulation layer 85 may be disposed on the second metal layer 75, the concave and convex structure may be provided in the peripheral region II. The concave and convex structure may include at least one metal layer and at least one of insulation layer pieces. In example embodiments, the concave and convex structure may include the first metal layer 45, the second metal layer 75, the first insulation layer pieces 60, and the second insulation layer pieces 65, as described above.

In example embodiments, to combine the first substrate 10 and the second substrate 140, the laser may be irradiated into the peripheral region II where the concave and convex structure and the sealant 135 are disposed. According to the laser irradiation, the phase of the sealant 135 may be changed (e.g., the sealant 135 may be melt) from the solid phase to the liquid phase. Additionally, the sealant 135 of the liquid phase may be changed to the solid phase after a predetermined time. In accordance with the phase change of the sealant 135, the second substrate 140 may be combined with the first substrate 10, thereby sealing the second substrate 140 with the first substrate 10. The first and the second metal layer 45 and 75 in the peripheral region II may absorb and/or reflect the energy of the laser while the laser is irradiated. The energy absorbed and/or reflected by the first metal layer 45 and the second metal layer 75 may be transferred to the sealant 135. Here, the energy may contribute to the phase change of the sealant 135. For example, the sealant 135 may be uniformly melted by the first and the second metal layer 45 and 75, so adhesive force of the sealant 135 may be generally improved. Since the sealant 135 may be disposed on the concave and convex structure, the contact interface (e.g., a bonding interface) between the sealant 135 and the concave and convex structure may be increased. As the adhesive force of the sealant 135 is increased, the adhesion strength between the first substrate 10 and the second substrate 140 may be enhanced.

Referring to FIGS. 1-6, in embodiments, the fourth insulation layer 85 includes protrusions extending through the second openings OP2 which may contact and be bonded to the third insulation layer pieces 55. In embodiments, each of the second insulation layer pieces 65 may include side surfaces which are not covered by the second metal layer 75 and can be exposed through the second openings OP2 of the second metal layer 75. The protrusions of the fourth insulation layer 85 may contact and be bonded to the exposed side surfaces of the second metal layer 75.

In embodiments illustrated in FIGS. 1-7, the insulation layer 85 contacts and is bonded to the insulation pieces 55 which are bonded to the insulation layer 30, and thus, the insulation layers 13, 30, 85 and the insulation pieces 55 and 65 may be integrated. Thus, the improved bondage can be provided. Further, in embodiments, the materials of the insulation layers 13, 30, 85 and the insulation pieces 55 and 65 can be selected to provide sufficient bondage at interfaces thereof. Further, in embodiments, the insulation layer pieces 65 are bonded to the insulation layer 85 while portions of the metal layer 75 are interposed therebetween, and thus, the detachment between the insulation structures and the metal layers 45 and 75 can be minimized or reduced.

FIGS. 8A to 8I are cross-sectional views illustrating a method of manufacturing a display device in accordance with example embodiments.

Figure 8A:
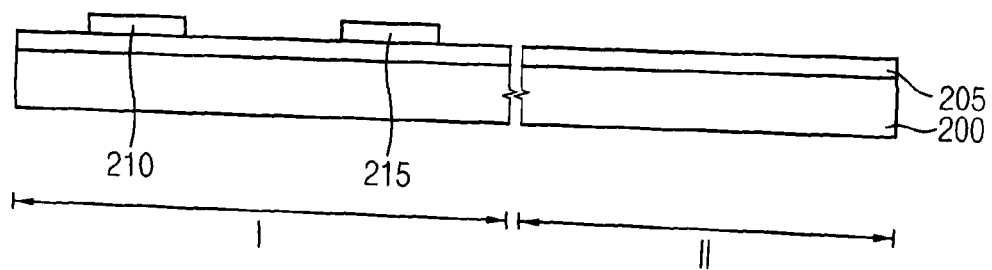
FIGS. 8A to 8I are cross-sectional views illustrating a method of manufacturing a display device in accordance with example embodiments.

Referring to FIG. 8A, a first insulation layer 205 may be formed on a first substrate 200. The first substrate 200 may be formed using a transparent inorganic material or flexible plastic. The first insulation layer 205 may be formed using an inorganic material or an organic material. In example embodiments, the first substrate 200 may have a display region I and a peripheral region II. The first insulation layer 205 may be formed in both of the display region I and the peripheral region II.

A first active element 210 and a second active element 215 may be formed on the first insulation layer 205 in the display region I. For example, each of the first active element 210 and the second active element 215 may be positioned at a first portion of the first insulation layer 205 and a second portion of the first insulation layer 205, respectively. Here, the first active element 210 and the second active element 215 may be spaced apart by a predetermined distance. Each of the first and the second active elements 210 and 215 may be formed using oxide semiconductor, inorganic semiconductor (e.g., amorphous silicon, polysilicon, etc.), organic semiconductor, etc.

Figure 8B:
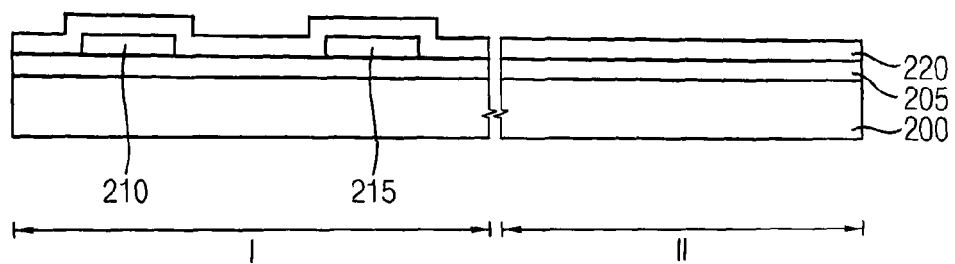

Referring to FIG. 8B, a second insulation layer 220 may be formed on the first insulation layer 205 and on the first and the second active elements 210 and 215. In example embodiments, the second insulation layer 220 may be formed on the first insulation layer 205 so that the second insulation layer 220 may substantially cover the first and the second active elements 210 and 215 in the display region I.

Meanwhile, the second insulation layer 220 may be directly formed on the first insulation layer 205 in the peripheral region II. The second insulation layer 220 may be formed using an inorganic material or an organic material.

Figure 8C:
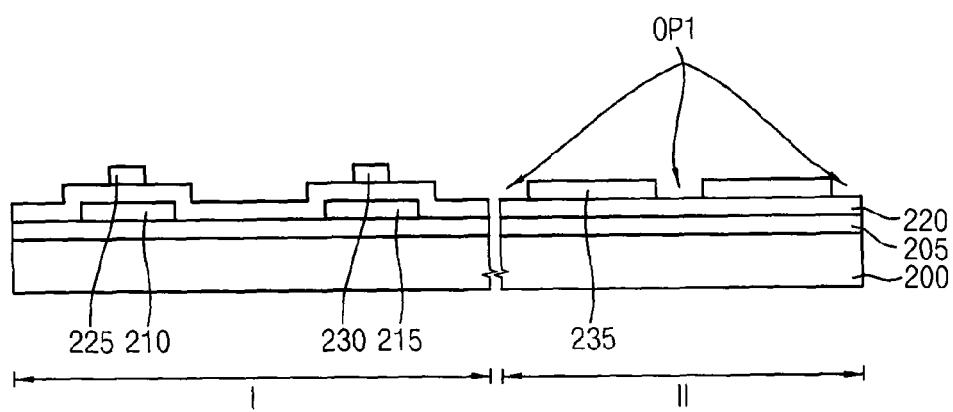

Referring to FIG. 8C, a first electrode 225, a second electrode 230 and a first metal layer 235 may be formed on the second insulation layer 220. In example embodiments, the first and the second electrodes 225 and 230 may be formed in the display region I whereas the first metal layer 235 may be formed in the peripheral region II. In display region I, the first and the second electrodes 225 and 230 may be formed on the second insulation layer 220, and the first active element 210 and the second active element 215 may be formed under the second insulation layer 220. Here, each of the first electrode 225 and the second electrode 230 may be positioned over the first active, element 210 and the second active element 215, respectively. In the peripheral region II, the first metal layer 235 may be directly formed on the second insulation layer 220. In example embodiments, a plurality of first openings OP1 may be formed in the first metal layer 235. For example, the first metal layer 235 including the first openings OP1 may have a substantial mesh structure.

Each of the first electrode 225, the second electrode 230 and the first metal layer 235 may be formed using metal, alloy, metal nitride, conductive metal oxide, a transparent conductive material, etc. In example embodiments, the first electrode 225, the second electrode 230 and the first metal layer 235 may be simultaneously formed.

Figure 8D:
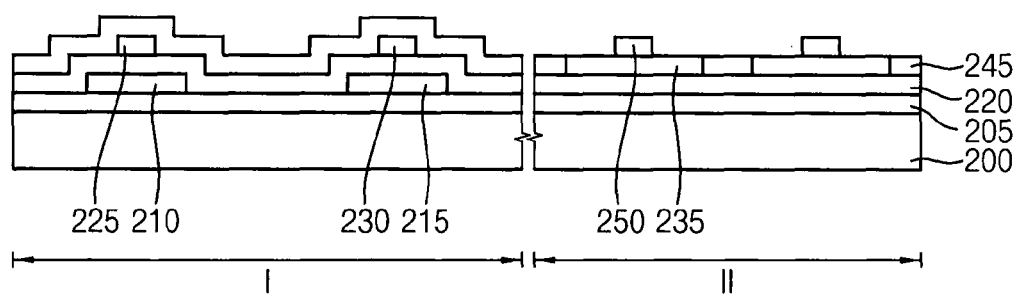

Referring to FIG. 8D, third insulation layer pieces 245 and first insulation layer pieces 250 may be formed over the second insulation layer 220. In example embodiments, the third insulation layer pieces 245 in display region I may be formed on the second insulation layer 220 so that the third insulation layer pieces 245 may substantially cover the first and the second electrodes 225 and 230. In the peripheral region II, the third insulation layer pieces 245 may be formed on the second insulation layer 220 such that the third insulation layer pieces 245 may substantially fill the first openings OP1 of the first metal layer 235. In example embodiments, the first insulation layer pieces 250 and second insulation layer pieces (not illustrated) may be formed on the first metal layer 235.

In example embodiments, the third insulation layer pieces 245 in the peripheral region II may substantially fill the first openings OP1 of the first metal layer 235. For example, after the third insulation layer pieces 245 is formed on the second insulation layer 220 and the first metal layer 235 in the peripheral region II, the first insulation layer pieces 250 and the second insulation layer pieces may be formed on the first metal layer 235 by patterning the third insulation layer pieces 245. The third insulation layer pieces 245, the first insulation layer pieces 250 and the second insulation layer pieces may be formed using an inorganic material or an organic material.

Figure 8E:
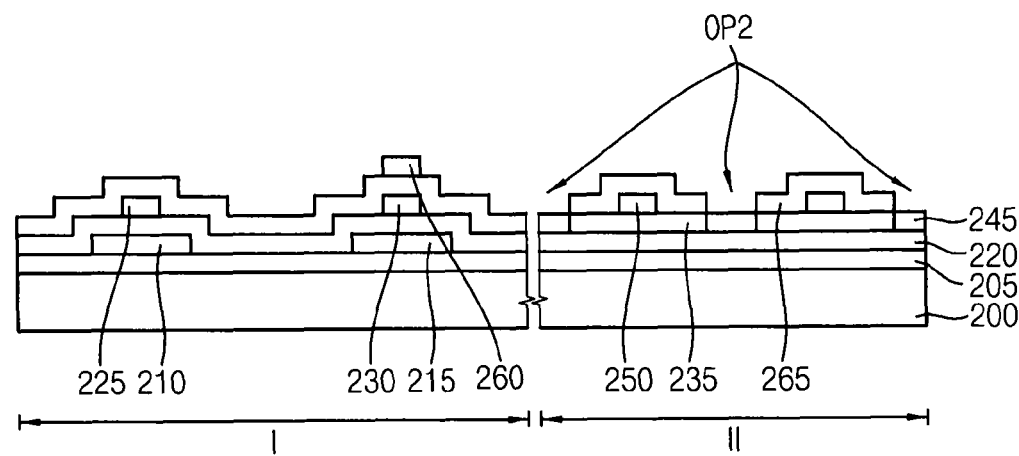

Referring to FIG. 8E, a third electrode 260 may be formed on a portion of the third insulation layer pieces 245 in the display region I. Thus, the second electrode 230 may be disposed under the third insulation layer pieces 245. That is, the third electrode 260 may be positioned over the second electrode 230. Additionally, in peripheral region II, the second metal layer 265 covering the first insulation layer pieces 250 and the second insulation layer pieces may be formed on the first metal layer 235. Here, a size of the second metal layer 265 may be substantially the same as or substantially similar to that of the first metal layer 235.

In example embodiments, a plurality of second openings OP2 may be formed in the second metal layer 265. A size of each second opening OP2 of the second metal layer 265 may be substantially the same as that of each first opening OP1 of the first metal layer 235. Further, the second openings OP2 and the first openings OP1 may have substantially same positions. In this case, the second metal layer 265 may make contact at least of portions of the first metal layer 235.

In accordance with the formation of the second metal layer 75, a preliminary concave and convex structure may be provided in the peripheral region II. In example embodiments, the preliminary concave and convex structure may include the first metal layer 235, the first insulation layer pieces 250, the second insulation layer pieces and the second metal layer 265.

The third electrode 260 and the second metal layer 265 may be simultaneously formed. For example, the third electrode 260 and the second metal layer 265 may be formed using metal, alloy, metal nitride, conductive metal oxide, a transparent conductive material, etc.

Figure 8F:
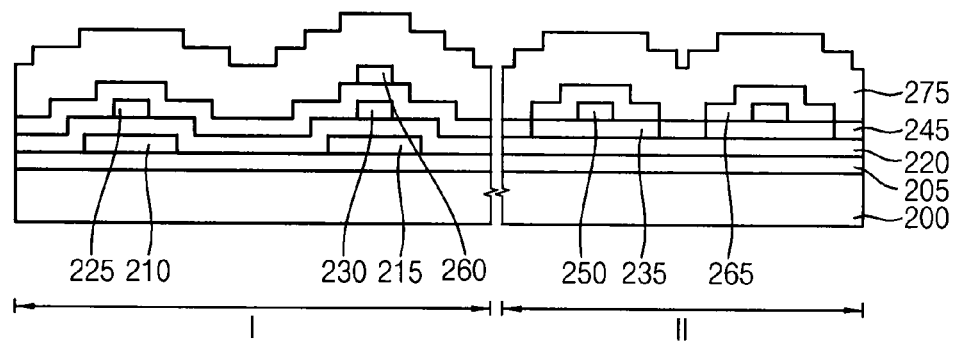

Referring to FIG. 8F, a fourth insulation layer 275 may be generally formed in the display region I and the peripheral region II of the first substrate 200. The fourth insulation layer 275 may have a thickness entirely cover underlying structures. The fourth insulation layer 275 may be formed using an inorganic material or an organic material. In example embodiments, in the display region I, the fourth insulation layer 275 may be formed on the third insulation layer pieces 245 to substantially cover the third electrode 260. In peripheral region II, the fourth insulation layer 275 may be formed on the third insulation layer pieces 245 to substantially cover the preliminary concave and convex structure. The fourth insulation layer 275 may substantially have a concave and convex shape along with a profile of the preliminary concave and convex structure. Hence, a concave and convex structure may be formed in the peripheral region II. The concave and convex structure may include the first metal layer 235, the first insulation layer pieces 250, second insulation layer pieces, the second metal layer 265 and the fourth insulation layer 275.

Figure 8G:
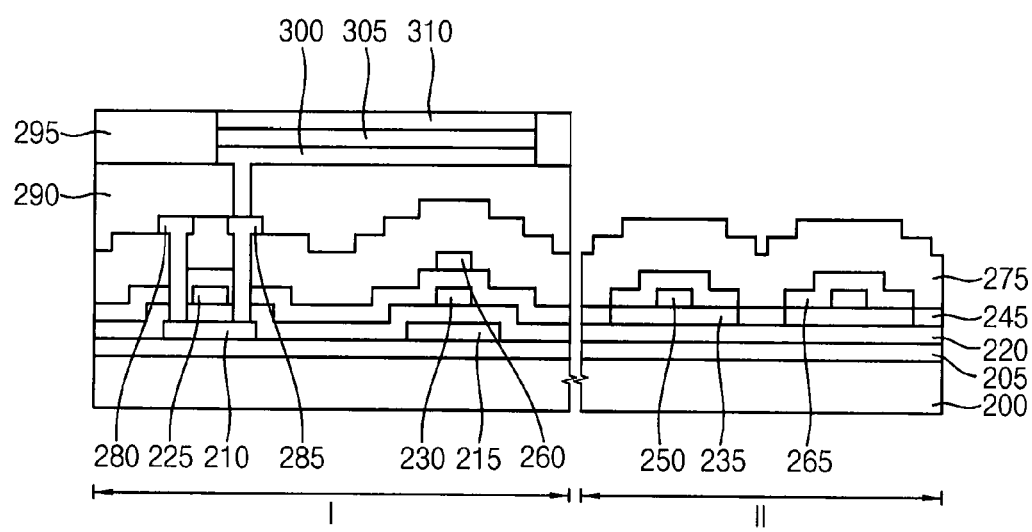

Referring to FIG. 8G, contact holes exposing the first active element 210 may be formed through the fourth insulation layer 275, the third insulation layer pieces 245 and the second insulation layer 220 in the display region I. A source electrode 280 and a drain electrode 285 may be formed on the fourth insulation layer 275 to substantially fill the contact holes, respectively. For example, each of the source and the drain electrodes 285 and 280 may be formed using metal, alloy, metal nitride, conductive metal oxide, a transparent conductive material, etc.

In the display region I, a fifth insulation layer 290 may be formed on the fourth insulation layer 275. For example, the fifth insulation layer 290 may be formed using the inorganic material or the organic material.

A hole partially exposing the drain electrode 285 may be formed through the fifth insulation layer 290. A bottom electrode 300 may be formed on the fifth insulation layer 290 to substantially fill the hole. The bottom electrode 300 may be electrically connected to the drain electrode 285. For example, the bottom electrode 300 may be formed using metal, alloy, metal nitride, conductive metal oxide, a transparent conductive material, etc.

A pixel defining layer 295 may be formed on the fifth insulation layer 290 in the display region I to define the bottom electrode 300. For example, the pixel defining layer 295 may be formed using an inorganic material or an organic material.

A light emitting layer 305 may be formed on the bottom electrode 300 defined by the pixel defining layer 295. The light emitting layer 305 may be formed as a multi-layered structure including an EL, an HIL, an HTL, an ETL, an EIL, etc. In example embodiments, the EL may include light emitting materials for generating different colors of light such as a red color of light, a blue color of light, and a green color of light in accordance with the types of pixels in the display device. In some example embodiments, the EL may generally generate a white color of light by stacking a plurality of light emitting materials for generating different colors of light such as a red color of light, a green color of light, a blue color of light, etc.

The top electrode 310 may be formed on the light emitting layer 305. The top electrode 310 may be formed using metal, alloy, metal nitride, conductive metal oxide, a transparent conductive material, etc.

Figure 8H:
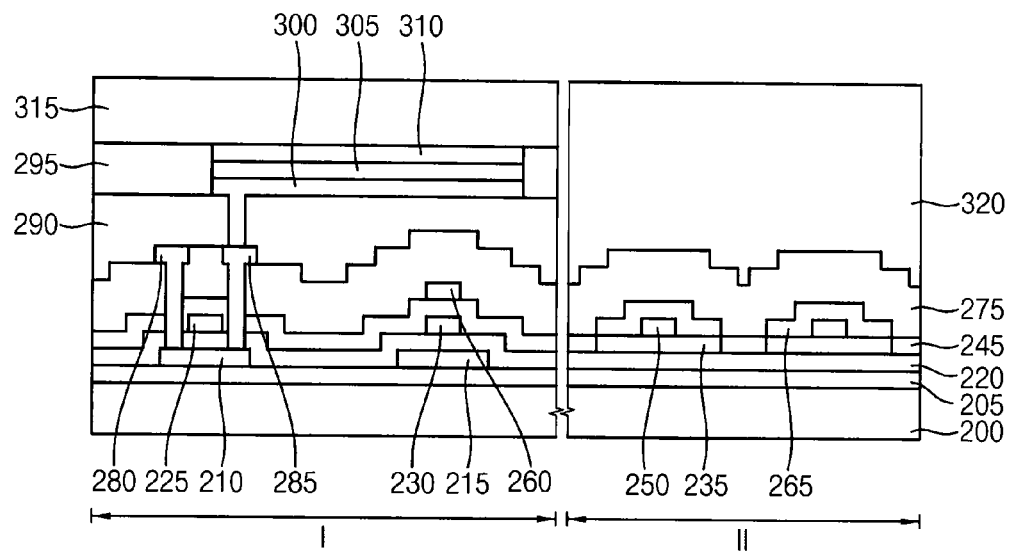

Referring to FIG. 8H, a protecting layer 315 may be formed in the display region I and a sealant 320 may be provided in the peripheral region II. The protecting layer 315 may be formed on the pixel defining layer 295 and the top electrode 310. For example, the protecting layer 315 may be formed using SiOx, metal oxide, etc.

The sealant 320 may have a substantially flat surface to cover the concave and convex structure. In example embodiments, a contact interface between the sealant 320 and the concave and convex structure may be increased because the concave and convex structure may have a substantially enlarged surface. Therefore, adhesive force of the sealant 320 relative to the concave and convex structure may be improved. For example, the sealant 320 may be formed using frit and the like.

Figure 8I:
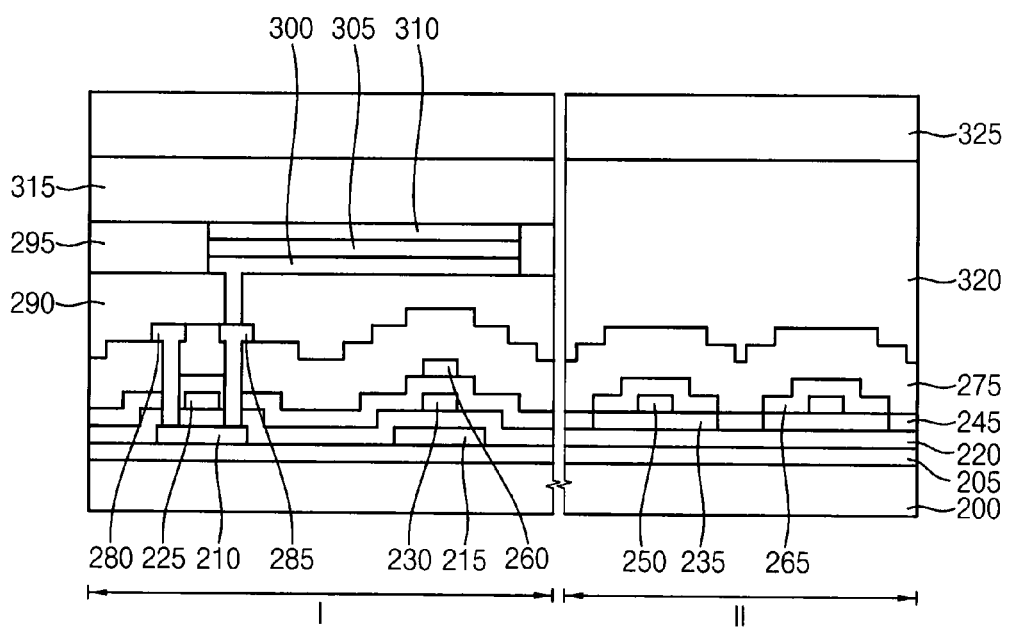

Referring to FIG. 8I, a second substrate 325 may be formed on the protecting layer 315 and the sealant 320. The second substrate 325 may be formed using a transparent insulation material, a flexible material, etc.

To combine the first substrate 200 with the second substrate 325, a laser may be irradiated into the peripheral region II where the sealant 320 and the concave and convex structure are located. Thus, the sealant 320 may be melt from a solid phase to a liquid phase during the laser irradiation. Additionally, the phase of the sealant 320 may be changed from the liquid phase to the solid phase after a predetermined time. In accordance with the phase change of the sealant 320, the second substrate 325 may be combined with the first substrate 200. That is, the second substrate 325 and the first substrate 200 may be sealed with the sealant 320. In example embodiments, when the laser is irradiated into the peripheral region II, the first and the second metal layer 235 and 265 in the peripheral region II may absorb and/or reflect energy of the laser. The energy absorbed and/or reflected by the first metal layer 235 and the second metal layer 265 may be transferred to the sealant 320. Accordingly, adhesive force of the sealant 320 may be enhanced because the sealant 320 may be uniformly melted and cured. Further, since contact interface between the sealant 320 and the concave and convex structure may be increased, adhesion strength (e.g., binding strength) between the first substrate 200 and the second substrate 325 may be improved.

Figure 9:
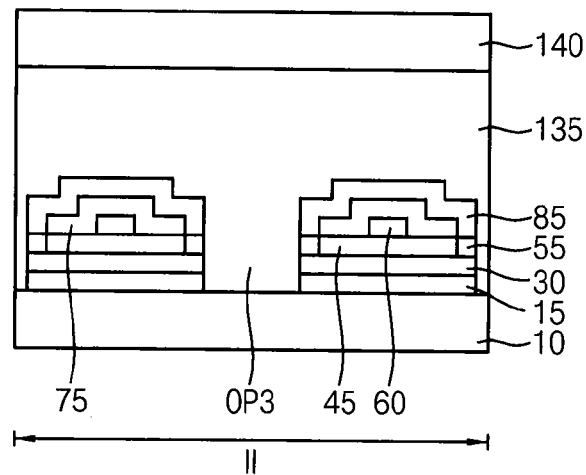
FIG. 9 is a cross-sectional view illustrating a display device in accordance with some example embodiments.

FIG. 9 is a cross-sectional view illustrating a display device in accordance with some example embodiments. A display device illustrated in FIG. 9 may have a configuration substantially the same as or substantially similar to that of the display device described with reference to FIG. 1 except a concave and convex structure that may additionally include third openings OP3. In FIG. 9, detailed descriptions for elements, which are substantially the same as or substantially similar to the elements described with reference to FIG. 1, will be omitted.

Referring to FIG. 9, the concave and convex structure of a display device may further include the third openings OP3. The third openings OP3 may be respectively located in the first openings OP1 of the first metal layer 45. In example embodiments, the second openings OP2 may expose portions of the first substrate 10 through the fourth insulation layer 85, the third insulation layer pieces 55, the second insulation layer 30, and the first insulation layer 15. A size of each third opening OP3 may be substantially less than that of each first opening OP1. When the concave and convex structure includes the third openings OP3 positioned within the first openings OP1, a surface of the concave and convex structure may be enlarged because of steps between inner walls of the first openings OP1 and inner walls of the third openings OP3. The contact interface of the sealant 135 and the concave and convex structure may also be increased, and thus the adhesive force of the sealant 135 may be more increased. Further, the adhesive force of the sealant 135 relative to the first substrate 10 may be enhanced because the third openings OP3 may expose the first substrate 10 (e.g., in case that the sealant 135 and the first substrate 10 may include the same materials). For example, when each of the first substrate 10 and the sealant 135 include a glass substrate and a frit, respectively, the adhesion strength between the first substrate 10 and the second substrate 140 may be more enhanced.

Figure 10A:
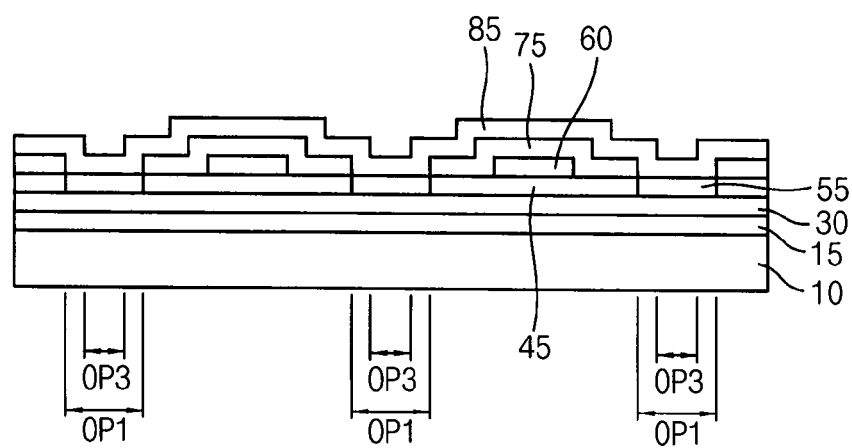
FIGS. 10A to 10C are cross-sectional views illustrating a method of manufacturing a display device in accordance with some example embodiments.
Figure 10B:
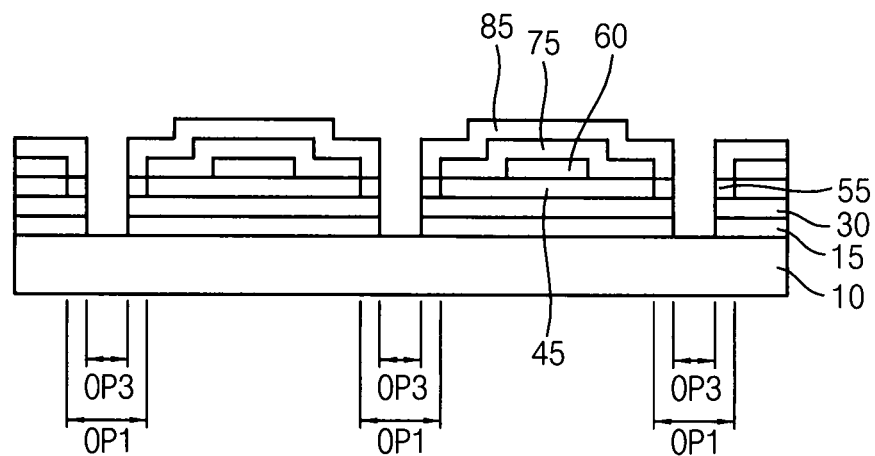
Figure 10C:
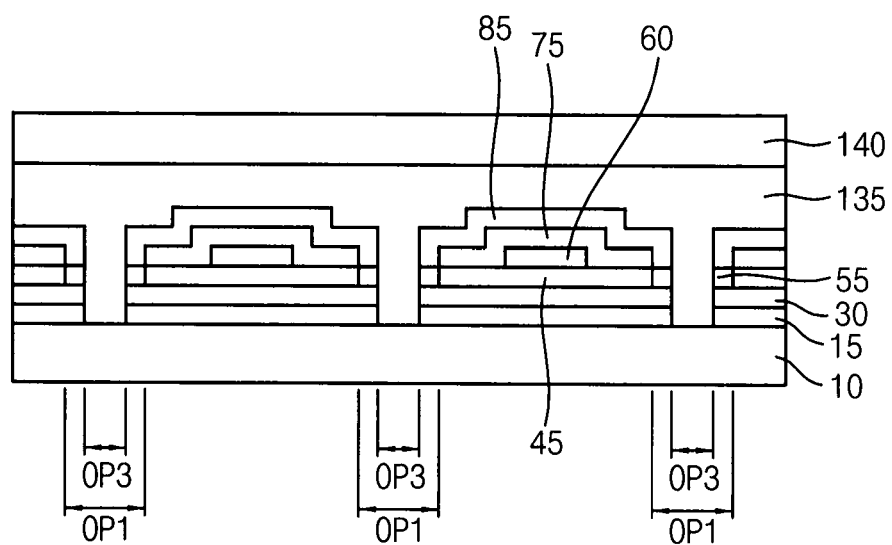

FIGS. 10A to 10C are cross-sectional views illustrating a method of manufacturing a display device in accordance with some example embodiments. A method of manufacturing a display device illustrated in FIGS. 10A to 10C may be substantially the same as or substantially similar to that for the display device described with reference to FIGS. 8A to 8I except a process for forming third openings OP3. In FIG. 10A to 10C, detailed descriptions for elements, which are substantially the same as or substantially similar to the elements described with reference to FIG. 8A to 8I, will be omitted.

Referring to FIG. 10A, a first insulation layer 15 may be formed on a first substrate 10 having a display region I and a peripheral region II. The first substrate 10 may be formed using a transparent inorganic material or flexible plastic. The first insulation layer 15 may be formed using an inorganic material or an organic material. A second insulation layer 30 may be formed on the first insulation layer 15. The second insulation layer 30 may be formed using an inorganic material or an organic material.

A first metal layer 45 may be formed on the second insulation layer 30 in the peripheral region II. The first metal layer 45 may be formed using metal, alloy, metal nitride, conductive metal oxide, a transparent conductive material, etc.

Third insulation layer pieces 55 may be formed on the second insulation layer 30. First insulation layer pieces 60 and second insulation layer pieces (not illustrated) may be formed on the first metal layer 45. In the peripheral region II, the third insulation layer pieces 55 may be formed on the second insulation layer 30 to substantially fill the first openings OP1 of the first metal layer 45. The third insulation layer pieces 55, the first insulation layer pieces 60 and the second insulation layer pieces may be formed using an inorganic material or an organic material.

In the peripheral region II, a second metal layer 75 may be formed on the first metal layer 45 to substantially cover the first insulation layer pieces 60 and the second insulation layer pieces on the first metal layer 45. A size of the second metal layer 75 may be substantially the same as or substantially similar to that of the first metal layer 45. A plurality of second openings (not illustrated) may be formed in the second metal layer 75. Here, a size of each second opening of the second metal layer 75 may be substantially the same as that of each first opening OP1 of the first metal layer 45. The second metal layer 75 having the second openings may contact at least portions of the first metal layer 45 having the first openings OP1. The second metal layer 75 may be formed using metal, alloy, metal nitride, conductive metal oxide, a transparent conductive material, etc.

A fourth insulation layer 85 may be formed on the third insulation layer pieces 55 to entirely cover underlying structures. The fourth insulation layer 85 may be formed using an inorganic material or an organic material. In the peripheral region II, the fourth insulation layer 85 may be formed on the third insulation layer pieces 55 to substantially cover the second metal layer 75. Accordingly, the concave and convex structure including the first metal layer 45, the first insulation layer pieces 60, the second insulation layer pieces, the second metal layer 75 and the fourth insulation layer 85 may be formed in the peripheral region II.

Referring to FIG. 10B, the third openings OP3 may be formed so that the first substrate 10 within the first openings OP1 may be partially exposed by the third openings OP3. In example embodiments, after an etching mask (not illustrated) may be disposed on the fourth insulation layer 85 in the peripheral region II, the third openings OP3 exposing portions of the first substrate 10 may be formed by partially removing the fourth insulation layer 85, the third insulation layer pieces 55, the second insulation layer 30, and the first insulation layer 15 using the etching mask. As the third openings OP3 are formed in the first openings OP1, steps may be generated between inner walls of the first openings OP1 and inner walls of the third openings OP3. Therefore, the concave and convex structure having the first openings OP1 may ensure an enlarged surface area.

Referring to FIG. 10C, a sealant 135 may be formed on the concave and convex structure to substantially fill the third openings OP3. The sealant 135 may have a substantially flat surface to sufficiently cover the concave and convex structure. In example embodiments, the concave and convex structure including the third openings OP3 may have the enlarged surface area, and thus contact interface between the sealant 135 and the concave and convex structure may be increased. The sealant 135 may contact the portions of the first substrate 10 exposed by the third openings OP3. Thus, adhesive force of the sealant 135 relative to the concave and convex structure and the first substrate 10 may be improved. When the first substrate 10 and the sealant 135 include the same material, the adhesive force of the sealant 135 relative to the first substrate 10 may be greatly increased. Accordingly, combination stability between the first substrate 10 and the second substrate 140 may be enhanced by improving adhesion strength between the first substrate 10 and the second substrate 140.

As described above, the second substrate 140 may be disposed on the sealant 135 contacting the first substrate 10 and the concave and convex structure. The second substrate 140 may be formed using a transparent insulation material, a flexible material, etc.

The invention may be applied to various electronic devices including concave and convex structures. For example, the invention may be employed to a mobile phone, a smart phone, a laptop, a tablet computer, a personal digital assistant (PDA), a portable multimedia player (PMP), a digital camera, a music player (e.g., MP3 player), a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
    a first substrate comprising a major surface, and further comprising a display region disposed over a generally central portion of the major surface, and a peripheral region disposed outside the display region;
    at least one lower insulation layer disposed over the first substrate;
    at least one transistor disposed over the at least one lower insulation layer over the display region of the first substrate;
    a light emitting structure disposed over the display region of the first substrate;
    a concave and convex structure disposed over the at least one lower insulation layer and over the peripheral region of the first substrate and comprising at least one metal layer;
    an upper insulation layer formed over the concave and convex structure, and comprising an uneven top surface;
    a sealant contacting and bonded to the uneven top surface of the upper insulation layer, wherein the sealant is formed only over the peripheral region, and includes a frit; and
    a second substrate disposed over the light emitting structure, and bonded to the sealant.

2. The display device of claim 1, wherein the sealant does not contact the at least one metal layer.

3. The display device of claim 1, wherein the concave and convex structure comprises:
    the at least one metal layer comprising a first metal layer disposed over the at least one lower insulation layer;
    first insulation layer pieces and second insulation layer pieces disposed over the first metal layer; and
    the at least one metal layer further comprising a second metal layer disposed over the first metal layer to cover the first and second insulation layer pieces.

4. The display device of claim 3, further comprising third insulation layer pieces, wherein the first metal layer includes a plurality of first openings, wherein each of the third insulation layer pieces is received in one of the first openings.

5. The display device of claim 3, wherein the first metal layer includes a plurality of first openings, wherein the first insulation layer pieces are arranged such that each of the first insulation layer pieces is positioned between immediately neighboring two of the first openings, and wherein the second insulation layer pieces are arranged such that each of the second insulation layer pieces is arranged between immediately neighboring two of the first openings.

6. The display device of claim 5, wherein rows of the first insulation layer pieces and rows of the second insulation layer pieces are alternately arranged.

7. The display device of claim 3, wherein the second metal layer includes a plurality of second openings each overlapping one of the first openings when viewing in a direction perpendicular to the major surface.

8. The display device of claim 4, further comprising third openings formed through the upper insulation layer, the third insulation layer pieces, and the at least one lower insulation layer, wherein the sealant comprises protrusions extending through the third openings and contacting the first substrate.

9. The display device of claim 8, wherein each of the third openings overlaps one of the first openings when viewing in a direction perpendicular to the major surface.

10. The display device of claim 1, wherein the at least one transistor includes a switching transistor and a driving transistor disposed over the at least one insulation layer in the display region.

11. The display device of claim 10, further comprising a capacitor disposed over the driving transistor.

12. A display device comprising:
a substrate comprising a major surface;
a cover opposing the substrate;
an array of light emitting pixels disposed over a generally central portion of the major surface, and interposed between the substrate and the cover;
a seal disposed over a peripheral portion of the substrate outside the generally central portion, the seal interposed between and interconnecting the substrate and the cover, and wherein the seal is formed only over the peripheral region, and includes a frit;
a lower insulation layer formed over the generally peripheral portion of the substrate;
a first metal layer formed over the lower insulation layer and comprising holes which are spaced from each other;
first insulation pieces, each received in one of the holes of the first metal layer;
a second metal layer formed over the first metal layer, and having a concave and convex shape;
second insulation pieces each placed between the first metal layer and one of the first raised portions of the second metal layer;
an upper insulation layer formed over the second metal layer, and comprising second raised portions formed over the first raised portions of the second metal layer and second valley portions each disposed between the immediately neighboring two of the second raised portions;
wherein the seal is bonded to and contacts top surfaces and side surfaces of the second raised portions and surfaces of the second valley portions of the upper insulation layer, which is bonded to and contacts the first insulation pieces, each of which is bonded to and contacts the lower insulation layer.

13. The display device of claim 12, wherein each of the second insulation pieces comprises side surfaces contacting and bonded to the upper insulation layer.

14. The display device of claim 12, wherein the second metal layer comprises openings each overlapping to one of the holes of the first metal layer when viewing in a direction perpendicular to the major surface, and the upper insulation layer comprises protrusions extending through the openings to contact the first insulation pieces.

15. The display device of claim 12, wherein each of the lower insulation layer, the upper insulation layer and the second metal layer comprises holes each overlapping one of the holes of the first metal layer when viewing in a direction perpendicular to the major surface, and the seal comprises protrusions extending through the holes to contact the substrate.

16. The display device of claim 12, wherein the array of light emitting pixels comprises metal layers and insulation layers wherein each of the first and second layers is formed of the same material as that of one of the metal layers of the array of light emitting pixels, wherein each of the top and lower insulation layers is formed of the same material as that of one of the insulation layers of the array of light emitting pixels, wherein the first insulation pieces are formed of the same material as that of one of the insulation layers of the array of light emitting pixels, wherein the second insulation pieces are formed of the same material as that of one of the insulation layers of the array of light emitting pixels.

17. The display device of claim 12, wherein at least one of the upper and lower insulation layers comprises two or more sub-layers formed one by one.

18. The display device of claim 12, wherein the seal does not contact any of the first and second metal layers.

19. The display device of claim 1, wherein the sealant has a top surface and a bottom surface closer to the substrate than the top surface, and wherein the bottom surface of the sealant has at least one stepped portion.

* * * * *